United States Patent
Hoshino et al.

(10) Patent No.: US 11,542,627 B2
(45) Date of Patent: Jan. 3, 2023

(54) ELECTROLYTIC PROCESSING JIG AND ELECTROLYTIC PROCESSING METHOD

(71) Applicant: Tokyo Electron Limited, Tokyo (JP)

(72) Inventors: Tomohisa Hoshino, Kumamoto (JP); Masato Hamada, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/330,812

(22) PCT Filed: Sep. 11, 2017

(86) PCT No.: PCT/JP2017/032675
§ 371 (c)(1),
(2) Date: Mar. 6, 2019

(87) PCT Pub. No.: WO2018/066315
PCT Pub. Date: Apr. 12, 2018

(65) Prior Publication Data
US 2019/0218682 A1  Jul. 18, 2019

(30) Foreign Application Priority Data

Oct. 7, 2016 (JP) .............. JP2016-198729

(51) Int. Cl.
*C25D 17/12* (2006.01)
*H01L 21/66* (2006.01)
(Continued)

(52) U.S. Cl.
CPC ........... *C25D 17/12* (2013.01); *C25D 17/001* (2013.01); *C25D 21/12* (2013.01);
(Continued)

(58) Field of Classification Search
CPC ......... C25D 7/12–7/126; C25D 17/001; C25D 17/06; C25D 21/12
See application file for complete search history.

(56) References Cited

U.S. PATENT DOCUMENTS

| 6,837,978 B1* | 1/2005 | Hey | ............ C25D 21/12 204/224 R |
|---|---|---|---|
| 2002/0027080 A1* | 3/2002 | Yoshioka | ............ C25D 17/02 205/123 |

(Continued)

FOREIGN PATENT DOCUMENTS

| JP | 2004-250747 A | 9/2004 |
|---|---|---|
| JP | 2007-138304 A | 6/2007 |

(Continued)

OTHER PUBLICATIONS

Google translation of JP 2010013680 A (Year: 2020).*
International Search Report for International Application No. PCT/JP2017/032675, dated Oct. 24, 2017.

*Primary Examiner* — Alexander W Keeling
(74) *Attorney, Agent, or Firm* — Pearne & Gordon LLP

(57) ABSTRACT

An electrolytic processing jig configured to perform an electrolytic processing on a processing target substrate includes a base body having a flat plate shape; an electrode provided at the base body; three or more terminals provided at the base body, each having elasticity and configured to be brought into contact with a peripheral portion of the processing target substrate; and a detecting unit configured to electrically detect a contact of at least one of the terminals with the processing target substrate.

13 Claims, 4 Drawing Sheets

(51) Int. Cl.
*H01L 21/288* (2006.01)
*C25D 17/00* (2006.01)
*C25D 21/12* (2006.01)
(52) U.S. Cl.
CPC .......... *H01L 21/2885* (2013.01); *H01L 22/10* (2013.01); *H01L 22/14* (2013.01)

(56) References Cited

U.S. PATENT DOCUMENTS

| 2004/0000485 A1* | 1/2004 | Preusse | C25D 21/12 205/83 |
| 2014/0367265 A1* | 12/2014 | Ravid | C25D 17/001 205/83 |
| 2015/0276835 A1* | 10/2015 | Minami | C25D 17/001 204/229.8 |
| 2017/0350033 A1* | 12/2017 | Fujikata | C25D 17/001 |

FOREIGN PATENT DOCUMENTS

| JP | 2010013680 A * | 1/2010 |
| JP | 2010-287648 A | 12/2010 |
| JP | 2013-166999 A | 8/2013 |
| JP | 2015-200017 A | 11/2015 |
| JP | 2015-200029 A | 11/2015 |

\* cited by examiner

ELECTROLYTIC PROCESSING JIG AND ELECTROLYTIC PROCESSING METHOD

CROSS-REFERENCE TO RELATED APPLICATION

This application claims the benefit of Japanese Patent Application No. 2016-198729 filed on Oct. 7, 2016, the entire disclosures of which are incorporated herein by reference.

TECHNICAL FIELD

The embodiments described herein pertain generally to an electrolytic processing jig configured to perform an electrolytic processing on a processing target substrate and an electrolytic processing method using the electrolytic processing jig.

BACKGROUND

An electrolytic process (electrolytic processing) is a technique used in various kinds of processings such as a plating processing and an etching processing. For example, the electrolytic processing is performed in a manufacturing process for a semiconductor device.

The aforementioned plating processing is conventionally performed by a plating apparatus described in Patent Document 1, for example. In the plating apparatus, a semiconductor wafer is placed to face an anode electrode with a plating target surface thereof facing downwards. Further, a supporting member configured to support the semiconductor wafer constitutes a cathode electrode connected to the semiconductor wafer. By flowing a plating liquid toward the plating target surface of the semiconductor wafer through the anode electrode, the plating processing is performed on the semiconductor wafer.

Further, the plating apparatus disclosed in Patent Document 1 is equipped with an ultrasonic oscillator, and by delivering an ultrasonic wave generated from this ultrasonic oscillator to the plating liquid, the plating liquid is agitated, so that uniformity of the plating processing is improved.

PRIOR ART DOCUMENT

Patent Document 1: Japanese Patent Laid-open Publication No. 2004-250747

DISCLOSURE OF THE INVENTION

Problems to be Solved by the Invention

When the plating apparatus described in Patent Document 1 is used, however, since the ultrasonic oscillator for agitating the plating liquid is required to improve the uniformity of the plating processing, a large-scale agitating device is needed. Because of a limit in the configuration of the plating apparatus, however, it may not be possible to provide such a large-scale agitating device therein.

In view of the foregoing, exemplary embodiments provide a technique capable of performing an electrolytic processing on a processing target substrate efficiently and appropriately.

Means for Solving the Problems

In an exemplary embodiment, an electrolytic processing jig configured to perform an electrolytic processing on a processing target substrate includes a base body having a flat plate shape; an electrode provided at the base body; three or more terminals provided at the base body, each having elasticity and configured to be brought into contact with a peripheral portion of the processing target substrate; and a detecting unit configured to electrically detect a contact of at least one of the terminals with the processing target substrate.

According to the exemplary embodiment, the terminals are brought into contact with the processing target substrate by moving the electrolytic processing jig and the processing target substrate to be relatively adjacent to each other. At this time, the contacts between the terminals and the processing target substrate can be detected by the detecting unit, so that these contacts can be carried out securely. Thereafter, by applying a voltage between the electrode and the processing target substrate in a state that a processing liquid is supplied between the electrode and the processing target substrate, the electrolytic processing is performed on the processing target substrate. Since the terminals are in contact with a peripheral portion of the processing target substrate and the terminals are in secure contact with the processing target substrate as stated above, the electrolytic processing can be performed uniformly. Besides, since a large-scale agitating device for agitating the processing liquid to improve uniformity of the electrolytic processing is not necessary, the apparatus configuration can be simplified. Therefore, the electrolytic processing can be performed efficiently and appropriately.

In another exemplary embodiment, there is provided an electrolytic processing method of performing an electrolytic processing on a processing target substrate by using an electrolytic processing jig. The electrolytic processing jig comprises a base body having a flat plate shape; an electrode provided at the base body; three or more terminals provided at the base body, each having elasticity and configured to be brought into contact with a peripheral portion of the processing target substrate; and a detecting unit configured to electrically detect a contact of at least one of the terminals with the processing target substrate. The electrolytic processing method comprises a first process of bringing the terminals into contact with the processing target substrate by moving the electrolytic processing jig and the processing target substrate to be adjacent to each other relatively; and a second process of performing the electrolytic processing on the processing target substrate by applying a voltage between the electrode and the processing target substrate in a state that a processing liquid is supplied between the electrode and the processing target substrate. In the first process, contacts between the terminals and the processing target substrate is detected.

Effect of the Invention

According to the exemplary embodiments as described above, the electrolytic processing can be performed on the processing target substrate efficiently and appropriately.

DETAILED DESCRIPTION

Hereinafter, exemplary embodiments will be described with reference to the accompanying drawings. However, it should be noted again that the exemplary embodiments are not limiting the present disclosure.

Figure 1:
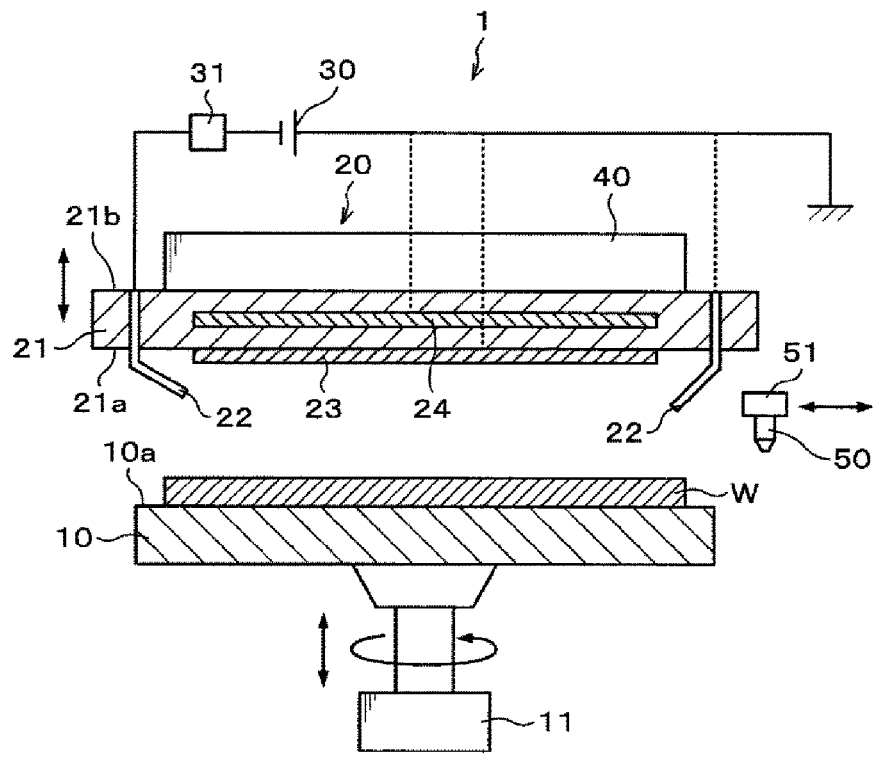
FIG. 1 is a diagram illustrating a schematic configuration of a manufacturing apparatus of a semiconductor device, equipped with an electrolytic processing jig according to an exemplary embodiment.

FIG. 1 is a diagram illustrating a schematic configuration of a manufacturing apparatus of a semiconductor device, equipped with an electrolytic processing jig according to the present exemplary embodiment. A manufacturing apparatus 1 is configured to perform a plating processing as an electrolytic processing on a semiconductor wafer W (hereinafter, simply referred to as "wafer W") as a processing target substrate. This wafer W is provided with a seed layer (not shown) formed on a surface thereof, and this seed layer is used as an electrode. Further, in the various drawings, sizes and dimensions of individual components do not necessarily correspond to actual sizes and dimensions thereof to ease understanding of the present disclosure.

The manufacturing apparatus 1 is equipped with a wafer holding unit 10. The wafer holding unit 10 is a spin chuck configured to hold and rotate the wafer W. The wafer holding unit 10 has a top surface 10a having a diameter larger than that of the wafer W when viewed from the top, and this top surface 10a is provided with, by way of example, a suction hole (not shown) for attracting the wafer W. The wafer W can be attracted to and held on the wafer holding unit 10 by being suctioned from this suction hole.

The wafer holding unit 10 is equipped with a driving device 11 having, for example, a motor. The wafer holding unit 10 can be rotated at a preset speed by the driving device 11. Further, the driving device 11 is equipped with an elevation driving unit (not shown) such as a cylinder, so the wafer holding unit 10 can be moved vertically.

An electrolytic processing jig 20 is provided above the wafer holding unit 10, facing the wafer holding unit 10. The electrolytic processing jig 20 has a base body 21 made of an insulator. The base body 21 is of a flat plate shape and has a bottom surface 21a having a diameter larger than the diameter of the wafer W when viewed from the top. The base body 21 is equipped with terminals 22, a direct electrode 23 and an indirect electrode 24.

The terminals 22 are protruded from the bottom surface 21a at a peripheral portion of the base body 21. The number of the terminals 22 may be, by way of example, eight (8), and these terminals 22 are arranged on a circumferential portion of the base body 21 at a regular interval. Further, each terminal 22 is bent and has elasticity. Further, the terminals 22 are arranged such that an imaginary plane formed by leading end portions of the terminals 22, that is, a plane formed by the leading end portions (points) of the respective terminals 22 is substantially parallel to a surface of the wafer W held by the wafer holding unit 10.

When a plating processing is performed, the terminals 22 come into contact with a peripheral portion of the wafer W (seed layer) to apply a voltage to the wafer W as will be described later. Further, the number of the terminals 22 is not limited to the example of the present exemplary embodiment as long as at least three or more terminals 22 are provided. Further, the shape of the terminal 22 is not limited to the shown example of the present exemplary embodiment as long as the terminal 22 has elasticity.

The direct electrode 23 is provided at the bottom surface 21a of the base body 21. The direct electrode 23 is placed to face the wafer W, which is held by the wafer holding unit 10, substantially in parallel with the wafer W. When performing the plating processing, the direct electrode 23 is brought into contact with the plating liquid on the wafer W as will be described later.

The indirect electrode 24 is provided within the base body 21. That is, the indirect electrode 24 is not exposed to the outside.

The terminals 22, the direct electrode 23 and the indirect electrode 24 are connected to a DC power supply 30. The terminals 22 are connected to a cathode side of the DC power supply 30. The direct electrode 23 and the indirection electrode 24 are connected to an anode side of the DC power supply 30.

Further, a detecting unit 31 is provided at a circuit connecting the DC power supply 30 and the terminals 22. The detecting unit 31 is a resistor meter configured to measure a resistance value between one of the multiple terminals 22 and another terminal 22. By measuring this resistance value, the detecting unit 31 electrically detects a contact of the terminal 22 with the wafer W as will be described later.

Figure 2:
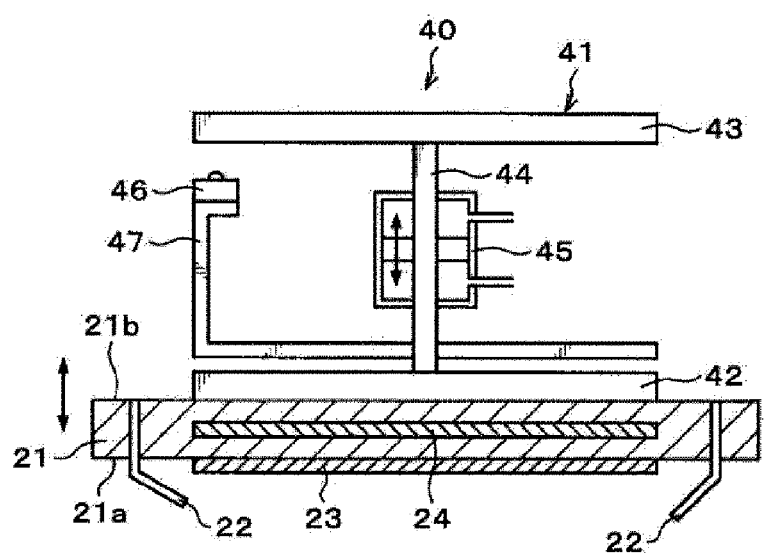
FIG. 2 is a diagram illustrating a schematic configuration of a moving device.

A moving device 40 configured to move the base body 21 is provided at a top surface 21b side of the base body 21. As depicted in FIG. 2, the moving device 40 is equipped with a pressing unit 41 configured to press the top surface 21b of the base body 21 to move the base body 21. The pressing unit 41 includes a pressing plate 42, a supporting plate 43 and a supporting column 44 formed as a single body. The pressing plate 42 is in contact with the top surface 21b of the base body 21, and the supporting plate 43 is configured to face the pressing plate 42. Each of the pressing plate 42 and the supporting plate 43 is a rigid body and is hardly deformed even if a load is applied thereon. The supporting column 44 is configured to connect the pressing plate 42 and the supporting plate 43.

The pressing unit 41 is equipped with an elevation driving unit 45 configured to move the pressing unit 41 up and down. The elevation driving unit 45 may be, by way of non-limiting example, an air bearing cylinder and is fastened to the supporting column 44. Further, the configuration of the elevation driving unit 45 is not merely limited to the one described in this exemplary embodiment as long as the elevation driving unit 45 can move the pressing unit 41.

A load measuring unit 46 is provided between the pressing plate 42 and the supporting plate 43. By way of non-limiting example, a load cell may be provided as the load measuring unit 46. The load measuring unit 46 is fixed to a supporting member 47. If the pressing unit 41 is moved down by the elevation driving unit 45 and the supporting plate 43 comes into contact with the load measuring unit 46, the load measuring unit 46 measures a load. The load measured by the load measuring unit 46 is a load applied to the terminal 22 as will be described later. Further, the configuration of the load measuring unit 46 is not limited to the one described in the present exemplary embodiment, and any of various configurations may be used as long as the load applied to the terminal 22 can be measured.

As illustrated in FIG. 1, a nozzle 50 for supplying the plating liquid onto the wafer W is provided between the wafer holding unit 10 and the electrolytic processing jig 20. The nozzle 50 is configured to be movable in the horizontal direction and the vertical direction by a moving mechanism 51 to be advanced to and retreated from the wafer holding unit 10. Further, the nozzle 50 communicates with a plating liquid source (not shown) which stores the plating liquid therein, and the plating liquid is supplied from this plating liquid source to the nozzle 50. Further, the plating liquid may be, by way of non-limiting example, a mixed solution of copper sulfate and sulfuric acid, and, in this case, copper ions are included in the plating liquid. Further, in the present exemplary embodiment, though the nozzle 50 is used as a processing liquid supply unit, various other kinds of devices may be used as a mechanism of supplying the plating liquid.

Furthermore, a cup (not shown) configured to receive and collect the liquid dispersed from or falling from the wafer W may be provided around the wafer holding unit 10.

The manufacturing apparatus 1 having the above-described configuration is equipped with a control unit (not shown). The control unit may be, for example, a computer and includes a program storage unit (not shown). The program storage unit stores a program for controlling a processing on the wafer W in the manufacturing apparatus 1. Further, the program may be recorded in a computer-readable recording medium such as a hard disk (HD), a flexible disk (FD), a compact disk (CD), a magnet optical disk (MO) or a memory card, and may be installed from this recording medium to the control unit.

Now, a plating processing in a manufacturing method using the manufacturing apparatus 1 configured as described above will be discussed. Table 1 shows a contact state of the terminals 22, a position of the electrolytic processing jig 20, a load measured by the load measuring unit 46 and a resistance value measured by the detecting unit 31 in each process of the plating processing.

TABLE 1

| Process | Processing (Terminal contact state) | Jig position | Load measuring unit | Detecting unit |
|---|---|---|---|---|
| S1 | Supply plating liquid (All terminals are not in contact) | P1 | 0 (gf) | ∞ (Ω) |
| S2 | Lower electrolytic processing jig (First terminal is in contact) | P2 | Measure load | ∞ (Ω) |
| S3 | Lower electrolytic processing jig (Second terminal is in contact) | P3 | Measure load | Measure preset resistance value |
| S4 | Lower electrolytic processing jig (All terminals are in contact) | P4 | Measure load | Measure preset resistance value |

TABLE 1-continued

| Process | Processing (Terminal contact state) | Jig position | Load measuring unit | Detecting unit |
|---|---|---|---|---|
| S5 | Lower electrolytic processing jig (All terminals are in contact + Pushed) | P5 | Measure load | Measure preset resistance value |
| S6 | Move copper ions by indirect electrode | P5 | — | — |
| S7 | Reduce copper ions by direct electrode | P5 | — | — |

Figure 3:
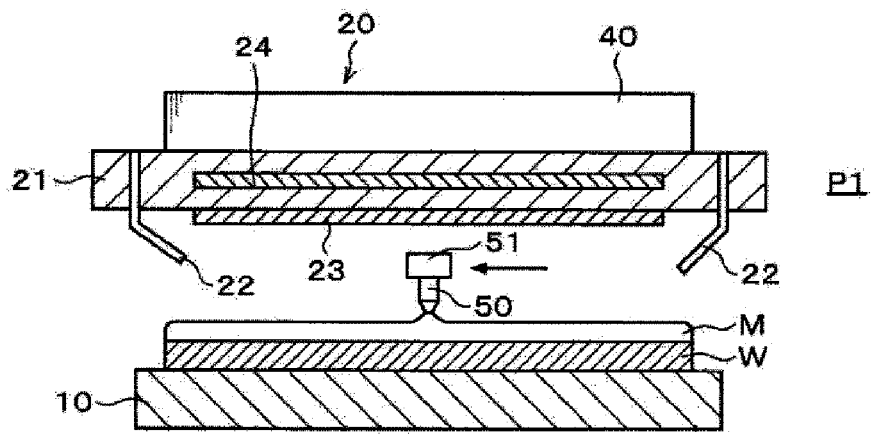
FIG. 3 is a diagram illustrating a state in which a liquid puddle of a plating liquid is being formed on a wafer.

First, as shown in FIG. 3, in the state that the wafer holding unit 10 and the electrolytic processing jig 20 are placed to face each other, the nozzle 50 is moved, by the moving mechanism 51, to a position above a central portion of the wafer W held by the wafer holding unit 10. Thereafter, while rotating the wafer W by the driving device 11, a plating liquid M is supplied to the central portion of the wafer W from the nozzle 50.

Figure 4:
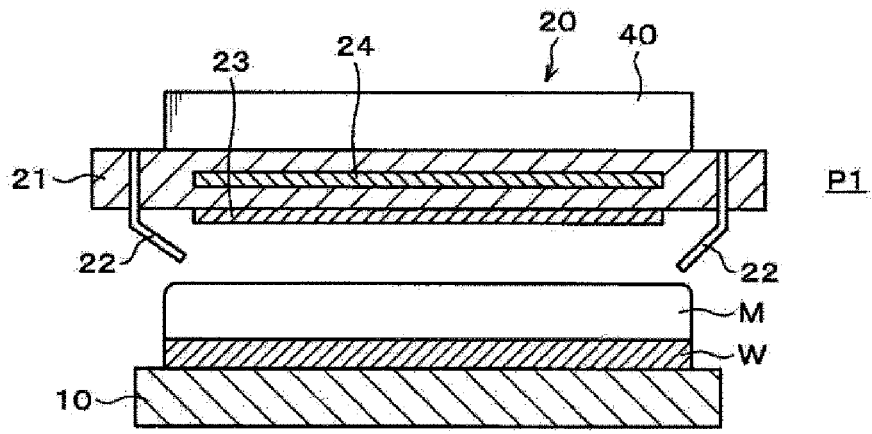
FIG. 4 is a diagram illustrating a state in which the liquid puddle of the plating liquid is formed on the wafer.

The supplied plating liquid M is diffused to the entire surface of the wafer W by a centrifugal force. At this time, as the wafer W is rotated, the plating liquid M is uniformly diffused within the surface of the wafer W. Then, if the supply of the plating liquid M from the nozzle 50 is stopped and the rotation of the wafer W is stopped, as shown in FIG. 4, the plating liquid M stays on the wafer W by a surface tension of the plating liquid M, so that a liquid puddle of the plating liquid M having a uniform thickness is formed (process S1 in Table 1).

In the process S1, the electrolytic processing jig 20 is not moved from a typical standby position, and a height position of the electrolytic processing jig 20 is P1. At this height position P1, a distance between the top surface 10*a* of the wafer holding unit 10 and the bottom surface 21*a* of the base body 21 of the electrolytic processing jig 20 is about 100 mm. All the terminals 22 are not in contact with the wafer W. Further, in the moving device 40, the load measuring unit 46 is not in contact with the supporting plate 43, and the load measured by the load measuring unit 46 is zero. Further, no electric current flows between the terminals 22, and the resistance value measured by the detecting unit 31 is infinite.

Then, the electrolytic processing jig 20 is lowered by the moving device 40. Here, although the imaginary plane formed by the leading end portions of the multiple terminals 22 is substantially parallel to the surface of the wafer W held by the wafer holding unit 10 as described above, there actually exists minute non-uniformity in the heights of the leading end portions of the terminals 22. Further, the base body 21 of the electrolytic processing jig 20 or the wafer W held by the wafer holding unit 10 has minute surface roughness and, also, a minute degree of inclination. That is, the surface of the wafer W is not completely flat. For these reasons, when the terminals 22 are brought into contact with the wafer W by lowering the electrolytic processing jig 20, timings when the individual terminals 22 come into contact with the wafer W are not uniform. Below, to facilitate understanding of the technical conception, the exemplary embodiment will be described for a case where all the multiple terminals 22 come into contact with the wafer W at different timings.

Figure 5:
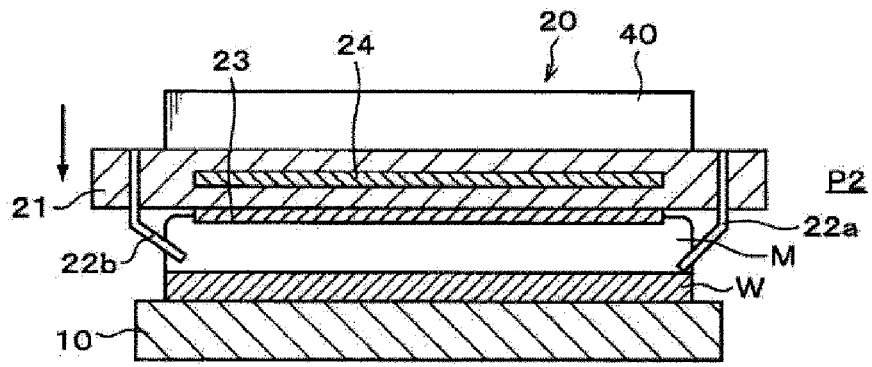
FIG. 5 is a diagram illustrating a state in which a first terminal is brought into contact with the wafer.

As shown in FIG. 5, if the electrolytic processing jig 20 is lowered, a first terminal 22*a* first comes into contact with the wafer W (process S2 in Table 1). At this time, a height position of the electrolytic processing jig 20 is P2. For example, the height position P2 serves as an origin height when performing teaching of height adjustment of the electrolytic processing jig 20 by the moving device 40.

Figure 6:
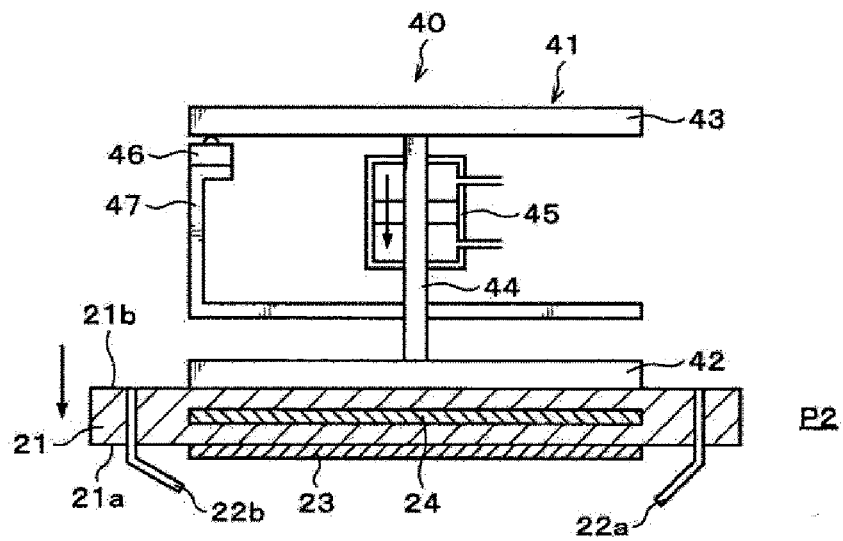
FIG. 6 is a diagram illustrating a state of the moving device when bringing the first terminal into contact with the wafer.

In the process S2, the load measuring unit 46 comes into contact with the supporting plate 43 as illustrated in FIG. 6, and a load is measured by the load measuring unit 46. That is, as the load measuring unit 46 measures the preset load, the contact of the first terminal 22a is detected.

Further, in the process S2, no electric current flows between the terminals 22, and the resistance value measured by the detecting unit 31 is infinite as in the process S1.

Figure 7:
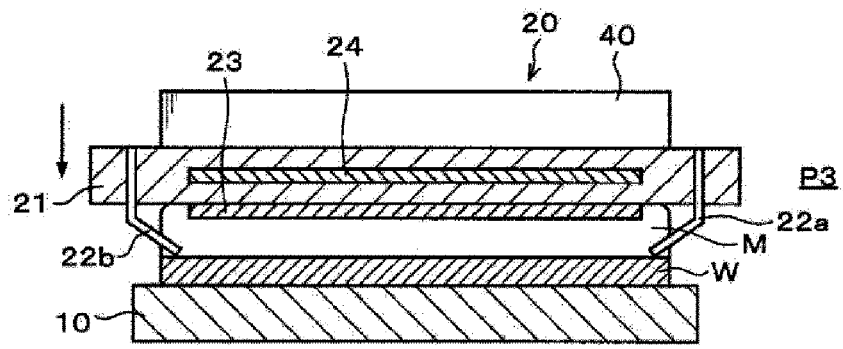
FIG. 7 is a diagram illustrating a state in which a second terminal is brought into contact with the wafer.

Thereafter, if the electrolytic processing jig 20 is further lowered as shown in FIG. 7, a second terminal 22b comes into contact with the wafer W (process S3 in Table 1). At this time, a height position of the electrolytic processing jig 20 is P3.

In the process S3, electric current flows between the first terminal 22a and the second terminal 22b via the wafer W. Accordingly, a preset resistance value corresponding to a resistance value of the wafer W is measured by the detecting unit 31. That is, as the detecting unit 31 measures the preset resistance value, the contact of the second terminal 22b is detected.

Furthermore, in the process S3, a load is measured by the load measuring unit 46. A load applied to the single terminal 22 is equivalent to a half of the load measured by the load measuring unit 46.

Figure 8:
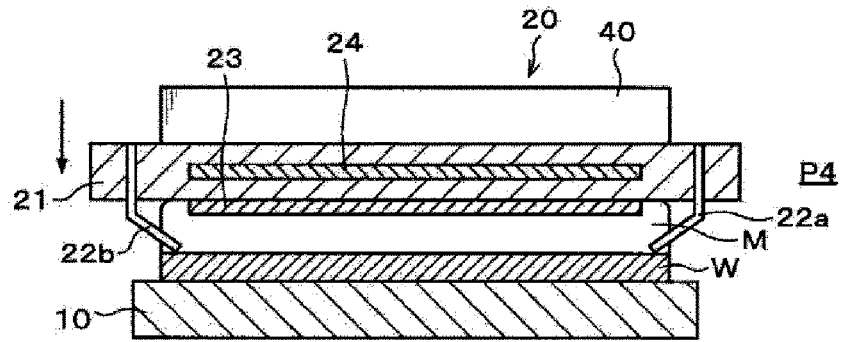
FIG. 8 is a diagram illustrating a state in which a third terminal to an eight terminal are brought into contact with the wafer.

Subsequently, the electrolytic processing jig 20 is further lowered as depicted in FIG. 8, and a third terminal 22 to an eighth terminal 22 are brought into contact with the wafer W in sequence, so that all the terminals 22 are in contact with the wafer W (process S4 in Table 1). At this time, a height position of the electrolytic processing jig 20 is P4. Here, as stated above, the height position P2 at which the first terminal 22a comes into contact with the wafer W is the origin height when performing the teaching of the height adjustment of the electrolytic processing jig 20. In this teaching, the height position P4 is used as a height at which all the terminals 22 are in contact with the wafer W.

In the process S4, electric current flows between the terminals 22 via the wafer W, as in the process S3. Accordingly, a preset resistance value corresponding to a resistance value of the wafer W is measured by the detecting unit 31. That is, as the detecting unit 31 measures the preset resistance value, the contact of the respective terminals 22 is detected.

Furthermore, in the process S4, a load is measured by the load measuring unit 46. The load applied to the single terminal 22 is equivalent to a value obtained by dividing the load measured from the load measuring unit 46 by the number of the terminals which are in contact with the wafer W.

Figure 9:
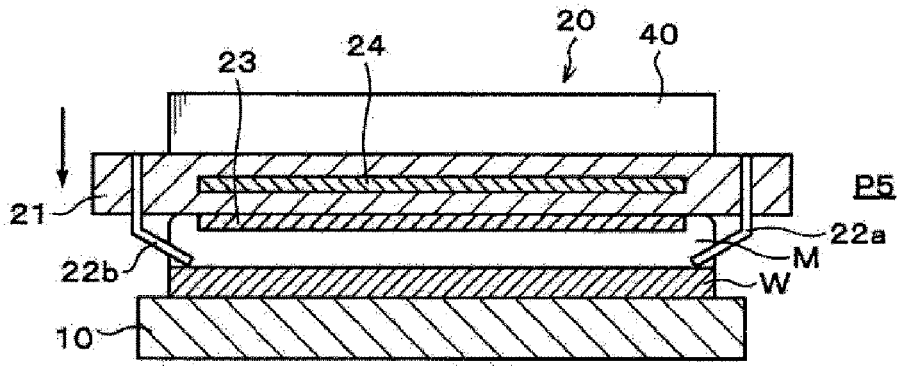
FIG. 9 is a diagram illustrating a state in which the electrolytic processing jig is moved by a preset distance after all the terminals are brought into contact with the wafer.

Afterwards, as depicted in FIG. 9, the electrolytic processing jig 20 is further lowered by a predetermined distance, for example, 1 mm (process S5 in Table 1). At this time, a height position of the electrolytic processing jig 20 is P5, and the distance between the top surface 10a of the wafer holding unit 10 and the bottom surface 21a of the base body 21 of the electrolytic processing jig 20 is about 1 mm. If all the terminals 22 are in contact with the wafer W in the process S4, a subsequent plating processing can be started. By further lowering the electrolytic processing jig 20 in the process S5, however, the contact between the terminals 22 and the wafer W can be made more securely.

When allowing all the terminals 22 to be in contact with the wafer W in the process S5 as stated above, the load applied to each terminal 22 is maintained at an appropriate load by controlling the moving device 40 based on the load measured by the load measuring unit 46. Thus, even for a thin film such as an oxide film or a highly rigid material on which it is difficult to form a contact point, electric contact points can be formed between the terminals 22 and the wafer W.

Moreover, when allowing all the terminals 22 to be in contact with the wafer W in the process S5, the direct electrode 23 is brought into contact with the plating liquid M on the wafer W. Though the contact between this direct electrode 23 and the plating liquid M may be performed in any of the processes S2 to S5, the direct electrode 23 needs to be in contact with the plating liquid M at least in the process S5.

In addition, since all the terminals 22 are in contact with the wafer W in the process S5, the surface of the electrolytic processing jig 20, that is, the bottom surface 21a of the base body 21 and the direct electrode 23 (hereinafter, simply referred to as the surface of the electrolytic processing jig 20) and the surface of the wafer W are parallel to each other. Therefore, the plating processing to be described later can be performed appropriately.

Figure 10:
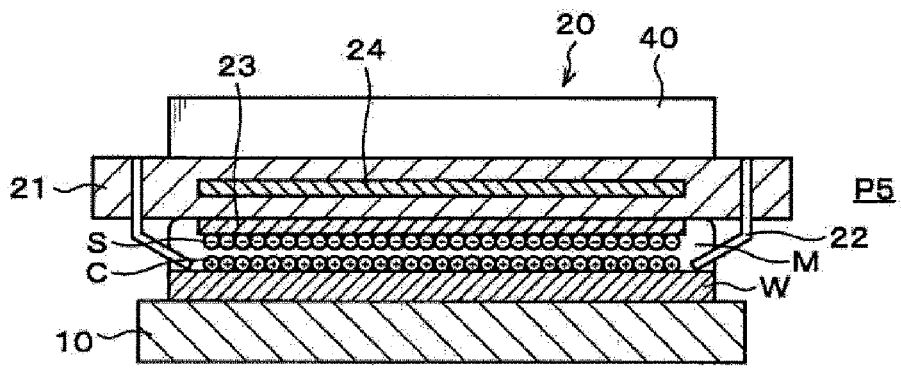
FIG. 10 is a diagram illustrating a state in which a voltage is applied between an indirect electrode and the wafer.

Afterwards, an electric field (electrostatic field) is formed by applying a DC voltage with the indirect electrode 24 as the anode and the wafer W as the cathode. As a result, sulfuric acid ions S as negatively charged particles are gathered at the front surface side of the electrolytic processing jig 20 (on the side of the indirect electrode 24 and the direct electrode 23), and copper ions C as positively charged particles are moved to the surface side of the wafer W, as depicted in FIG. 10 (process S6 in Table 1).

Here, to avoid the direct electrode 23 from serving as the cathode, the direct electrode 23 is set in an electrically floating state without being connected to the ground. In this case, since charge exchange is suppressed in the surfaces of the electrolytic processing jig 20 and the wafer W, the electrically charged particles attracted by the electrostatic field are arranged on the surfaces of the electrode. Further, the copper ions C are uniformly arranged on the surface of the wafer W. Further, since the charge exchange of the copper ions C is not performed and electrolysis of water is suppressed on the surface of the wafer W, an electric field can be strengthen when the voltage is applied between the indirect electrode 24 and the wafer W. Further, as the movement of the copper ions C can be accelerated by this high electric field, a plating rate of the plating processing can be improved. Further, by controlling this electric field as required, the copper ions C arranged on the surface of the wafer W is also controlled as required.

Figure 11:
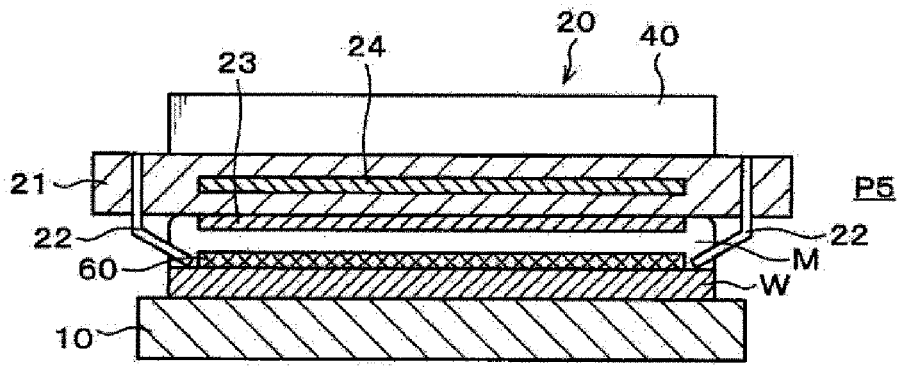
FIG. 11 is a diagram illustrating a state in which a voltage is applied between a direct electrode and the wafer.

Then, if a sufficient amount of the copper ions C is moved toward the wafer W side to be accumulated thereon, a voltage is applied with the direct electrode 23 as the anode and the wafer W as the cathode, so that an electric current is allowed to flow between the direct electrode 23 and the wafer W. As a result, as depicted in FIG. 11, the charge exchange of the copper ions C uniformly arranged on the surface of the wafer W is performed, so that the copper ions C are reduced and a copper plate 60 is precipitated on the surface of the wafer W (process S7 in Table 1). At this time, the sulfuric acid ions S are oxidized by the direct electrode 23.

Since the copper ions C are reduced in the state that they are sufficiently accumulated to be uniformly arranged on the surface of the W, the copper plate 60 can be uniformly precipitated on the surface of the wafer W. As a consequence, density of crystals in the copper plate 60 is increased, so that the copper plate 60 having high quality can be formed. Further, since the reduction is carried out in the state that the copper ions C are uniformly arranged on the surface of the wafer W, the copper plate 60 can be uniformly formed with high quality.

As the supply of the plating liquid M from the nozzle 50, the movement of the copper ions C by the indirect electrode 24 and the reduction of the copper ions C by the direct electrode 23 and the wafer W as described above are repeated, the copper plate 60 grows to have a preset film thickness. Through the above-described operations, the series of plating processing in the manufacturing apparatus 1 are completed.

According to the exemplary embodiment as stated above, if the electrolytic processing jig 20 is lowered, the contact between the first terminal 22 and the wafer W is detected by the load measuring unit 46, and then, the subsequent contacts between the second terminal 22 to the eighth terminal 22 are detected by the detecting unit 31. Since the electrolytic processing jig 20 is further lowered after the contacts between the terminals 22 and the wafer W are detected by the load measuring unit 46 and the detecting unit 31, the contact of all the terminals 22 with the wafer W can be carried out securely. As the contacts between all the terminals 22 and the wafer W is secured, the subsequent plating processing can be performed uniformly.

Further, as the terminals 22 are not only in secure contact with the wafer W but also in contact with the peripheral portion of the wafer W, the plating processing can be performed uniformly in the region surrounded by these multiple terminals 22.

Here, it may be considered to control the contact between the terminal 22 and the wafer W by a moving distance of the electrolytic processing jig 20. However, by detecting the actual contact by using the load measuring unit 46 and the detecting unit 31 as in the present exemplary embodiment, accuracy in the detection of the contact can be improved.

Moreover, when performing the plating processing, the direct electrode 23 of the electrolytic processing jig 20 and the plating liquid on the wafer W need to be brought into contact with each other. Since the distance between the surface of the electrolytic processing jig 20 and the surface of the wafer W is minute, the surface of the electrolytic processing jig 20 and the surface of the wafer W need to be parallel to each other inevitably. In this regard, since the imaginary plane formed by the leading end portions of the multiple terminals 22 is substantially parallel to the surface of the wafer W, the surface of the electrolytic processing jig 20 and the surface of the wafer W are made to be parallel to each other when the terminals 22 and the wafer W come into contact with each other. That is, since the multiple terminals 22 are provided at the electrolytic processing jig 20, the parallelism between the surface of the electrolytic processing jig 20 and the surface of the wafer W is guaranteed. From this point of view as well, the plating processing can be performed appropriately.

In addition, since an amount of the plating liquid M between the electrolytic processing jig 20 and the wafer W affects uniformity in a film thickness (film formation amount) of the copper plate 60, the distance between the surface of the electrolytic processing jig 20 and the surface of the wafer W is important. In the present exemplary embodiment, the surface of the electrolytic processing jig 20 and the surface of the wafer W are made to be parallel to each other, and the minute distance therebetween can be maintained. Therefore, the amount of the plating liquid M can be appropriately controlled and stabilized, so that the plating processing can be performed uniformly.

In the above-described exemplary embodiment, the detecting unit 31 is the resistor meter configured to measure the resistance value between one terminal 22 and another terminal 22. Instead, however, the detecting unit 31 may be a current meter configured to detect presence/absence of the electric current flowing in the single terminal 22.

In such a case, when the first terminal 22 comes into contact with the wafer W in the process S2, the detecting unit 31 detects the electric current flowing in this first terminal 22, that is, detects open/short in this first terminal 22. Accordingly, the contact of the first terminal 22 is detected. At this time, the detection of the contact of the first terminal 22 by the load measuring unit 46 may be omitted.

Further, in the processes S3 and S4, when the second terminal 22 to the eighth terminal 22 come into contact with the wafer W, the detecting unit 31 detects the electric current flowing in each of the second terminal 22 to the eighth terminal 22, so that the contacts of the terminals 22 are detected.

In the present exemplary embodiment as well, the same effect as obtained in the above-described exemplary embodiment can be achieved. That is, the contacts between all the terminals 22 and the wafer W are secured, so that the plating processing can be performed uniformly.

The electrolytic processing jig 20 in the exemplary embodiments described above may be further equipped with an alarming unit (not shown) configured to, based on the detection result of the detecting unit 31, set forth an alarm when the contact of the terminal 22 with the wafer W is poor. By way of example, if one of the multiple terminals 22 is in a non-conducting state (for example, the resistance value detected by the detecting unit 31 is changed), this terminal 22 might have been cut off or damaged. In such a case, there might be caused a failure in the contact between this terminal 22 and the wafer W, and, as a result, the plating processing cannot be performed appropriately.

Thus, when the contact failure of the terminal 22 is detected by the detecting unit 31 in the processes S2 to S4, the alarming unit sets forth the alarm, and the terminal 22 which is in the contact failure can be replaced. Therefore, the plating processing in the subsequent processes S6 and S7 can be appropriately performed, and a yield of the wafer W as a product can be bettered.

In the above-described exemplary embodiments, the plating processing is performed after all the terminals 22 are brought into contact with the wafer W. However, the plating processing in the processes S6 and S7 may be performed in a stage where a preset number of terminals 22 of the electrolytic processing jig 20, not all of the multiple terminals 22, are in contact with the wafer W. For example, if the number of the terminals 22 provided at the electrolytic processing jig 20 is increased to, e.g., sixteen or thirty two, an influence per the single terminal 22 is diminished, so all of the terminals 22 need not be brought into contact with the wafer W. Further, in the above-described exemplary embodiments, though the terminals 22 have dual functions of performing both the contact detection and the electrolytic processing, a part of the terminals 22 may be used for the contact detection, while the others may be used for the electrolytic processing.

In the above-described exemplary embodiments, the terminals 22 are brought into contact with the wafer W by lowering the electrolytic processing jig 20 through the moving device 40. In the manufacturing apparatus 1, however, the wafer holding unit 10 may be raised by the driving device 11. Alternatively, both the electrolytic processing jig 20 and the wafer holding unit 10 may be moved. Still more, the placement of the electrolytic processing jig 20 and the wafer holding unit 10 may be reversed, and the electrolytic processing jig 20 may be placed under the wafer holding unit 10.

In the above-describe exemplary embodiments, after the liquid puddle of the plating liquid M is formed on the wafer W in the process S1, the terminals 22 are brought into contact with the wafer W in the processes S2 to S5. However, the sequence of the process S1 and the processes S2 to S5 may be reversed. That is, the liquid puddle of the plating liquid M may be formed on the wafer W after the terminals 22 are brought into contact with the wafer W. In such a case, a liquid supply path (not shown) may be formed at the electrolytic processing jig 20 to supply the plating liquid M.

In the above-described exemplary embodiments, though the indirect electrode 24 is provided at the electrolytic processing jig 20, this indirect electrode 24 may be omitted. In such a case, the process S6 is omitted, and the plating processing of the process S7 is performed after the process S5.

In the above-described exemplary embodiments, the wafer holding unit 10 is configured as the spin chuck. Instead, a cup having an open top and storing therein the plating liquid M may be used.

The above exemplary embodiments have been described for an example where the plating processing is performed as the electrolytic processing. However, the present disclosure may be applicable to various kinds of electrolytic processing such as etching processing.

Further, the exemplary embodiments have been described for the example where the copper ions C are reduced on the front surface side of the wafer W. However, the present disclosure is also applicable to a case where processing target ions are oxidized at the front surface side of the wafer W. In such a case, the processing target ions are negative ions, and the same electrolytic processing may be performed while setting the anode and the cathode in the reverse way. In this exemplary embodiment, though there is a difference between the oxidation and the reduction of the processing target ions, the same effects as those of the above-described exemplary embodiments can be achieved.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

EXPLANATION OF CODES

1: Manufacturing apparatus
20: Electrolytic processing jig
21: Base body
22: Terminal
23: Direct electrode
24: Indirect electrode
30: DC power supply
31: detecting unit
40: Moving device
60: Copper plate
C: Copper ion
M: Plating liquid
S: Sulfuric acid ion
W: Wafer (semiconductor wafer)

We claim:

1. An electrolytic processing jig configured to perform an electrolytic processing on a processing target substrate, comprising:
a holding unit having a flat plate shape and configured to hold and rotate the processing target substrate;
a base body having a flat plate shape and positioned above the processing target substrate held by the holding unit;
an electrode provided at the base body;
three or more terminals provided at the base body, each having elasticity and configured to be brought into contact with a peripheral portion of the processing target substrate;
a detecting unit configured to electrically detect an electrical contact of at least one of the terminals with the processing target substrate;
a moving device configured to move the base body based on a detecting result by the detecting unit such that all of the three or more terminals are in contact with the peripheral portion of the processing target substrate,
a load measuring unit configured to measure a weight load applied to the terminals, and
a controller configured to:
control the moving device to lower the base body to a first height position, wherein when the weight load measured by the load measuring unit increases from zero to a preset load, a contact between one of the three or more terminals and the processing target substrate is detected by the load measuring unit, wherein said one of the three or more terminals is the terminal that first comes into contact with the processing target substrate,
control the moving device to lower the base body to a second height position below the first height position,
detect a contact between all of the three or more terminals and the processing target substrate based on the detecting result by the detecting unit and the weight load measured by the load measuring unit, and
after all of the three or more terminals are in electrical contact with the peripheral portion of the processing target substrate, control the moving device to lower the base body to a third height position below the second height position.

2. The electrolytic processing jig of claim 1,
wherein the detecting unit is configured to measure a resistance value between one of the terminals and another of the terminals.

3. The electrolytic processing jig of claim 1,
wherein the detecting unit is configured to detect presence/absence of an electric current flowing in the terminal.

4. The electrolytic processing jig of claim 1, further comprising:
an alarming unit configured to, based on a detection result of the detecting unit, set forth an alarm when there is a failure in the contact of the terminal with the processing target substrate.

5. An electrolytic processing method of performing an electrolytic processing on a processing target substrate by using an electrolytic processing jig,
wherein the electrolytic processing jig comprises:
a holding unit having a flat plate shape and configured to hold and rotate the processing target substrate;

a base body having a flat plate shape and positioned above the processing target substrate held by the holding unit;

an electrode provided at the base body;

three or more terminals provided at the base body, each having elasticity and configured to be brought into contact with a peripheral portion of the processing target substrate;

a detecting unit configured to electrically detect an electrical contact of at least one of the terminals with the processing target substrate;

a moving device configured to move the base body, a load measuring unit configured to measure a weight load applied to the terminals, and a controller, wherein the electrolytic processing method comprises:

a first process of bringing the terminals into contact with the processing target substrate by moving the electrolytic processing jig and the processing target substrate to be adjacent to each other relatively; and a second process of performing the electrolytic processing on the processing target substrate by applying a voltage between the electrode and the processing target substrate in a state that a processing liquid is supplied between the electrode and the processing target substrate, and in the first process, contacts between the terminals and the processing target substrate is detected by the detecting unit, and the moving device is configured to move the base body based on a detecting result by the detecting unit such that all of the three or more terminals are in contact with the peripheral portion of the processing target substrate, and in the first process, the controller is configured to control the moving device to lower the base body to a first height position, when the weight load measured by the load measuring unit increases from zero to a preset load, a contact between one of the three or more terminals and the processing target substrate is detected by the load measuring unit, wherein said one of the three or more terminals is the terminal that first comes into contact with the processing target substrate, the controller is further configured to control the moving device to lower the base body to a second height position below the first height position, detect a contact between all of the three or more terminals and the processing target substrate based on the detecting result by the detecting unit and the weight load measured by the load measuring unit, and after all of the three or more terminals are in electrical contact with the peripheral portion of the processing target substrate, control the moving device to lower the base body to a third height position below the second height position.

6. The electrolytic processing method of claim 5,
wherein in the first process, a resistance value between one of the terminals and another of the terminals is measured by the detecting unit, and the contact between the terminal and the processing target substrate is detected when the measured resistance value is a preset resistance value.

7. The electrolytic processing method of claim 5,
wherein in the first process, presence/absence of an electric current flowing in the terminal is detected by the detecting unit, and the contact between the terminal and the processing target substrate is detected when the electric current is found to flow in the terminal.

8. The electrolytic processing method of claim 5,
wherein in the first process, after a preset number of the terminals are brought into contact with the processing target substrate, the electrolytic processing jig and the processing target substrate are moved at a preset distance to be adjacent to each other relatively.

9. The electrolytic processing method of claim 5,
wherein in the first process, based on a detection result of the detecting unit, an alarming unit sets forth an alarm when there is a failure in the contact of the terminal with the processing target substrate.

10. The electrolytic processing jig of claim 1,
wherein each of the three or more terminals is bent.

11. The electrolytic processing jig of claim 1,
wherein when the three or more terminals are in contact with the processing target substrate, the base body is not contact with a holding unit which holds the processing target substrate.

12. The electrolytic processing jig of claim 1,
wherein the holding unit is a spin chuck.

13. The electrolytic processing jig of claim 1,
wherein the holding unit is provided with a suction hole for attracting the processing target substrate, and
the processing target substrate is held on the holding unit by being suctioned from the suction hole.

\* \* \* \* \*